United States Patent
Puthucode

(10) Patent No.: US 6,766,274 B2
(45) Date of Patent: Jul. 20, 2004

(54) DETERMINING THE FAILURE RATE OF AN INTEGRATED CIRCUIT

(75) Inventor: Suresh R. Puthucode, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/196,920

(22) Filed: Jul. 17, 2002

(65) Prior Publication Data

US 2003/0028352 A1 Feb. 6, 2003

Related U.S. Application Data

(60) Provisional application No. 60/309,785, filed on Aug. 6, 2001.

(51) Int. Cl.$^7$ ............................ G06F 10/14; G06F 17/50
(52) U.S. Cl. .............................. 702/181; 716/4; 716/10
(58) Field of Search ........................... 702/81, 108, 118, 702/123, 181, 182; 714/726, 736, 738, 739; 716/1–21

(56) References Cited

U.S. PATENT DOCUMENTS 6,470,479 B1 * 10/2002 Yamamoto ..................... 716/4
2002/0157074 A1 * 10/2002 Sato ............................ 716/10

* cited by examiner

Primary Examiner—John Barlow
Assistant Examiner—John H Le
(74) Attorney, Agent, or Firm—Robert D. Marshall, Jr.; W. James Brady, III; Frederick J. Telecky, Jr.

(57) ABSTRACT

The failure rate of an integrated circuit (IC) is quickly determined by analyzing the corresponding design. The IC is partitioned into multiple cells, with each cell typically containing a logic gate. A default input signal is assumed for each cell and the default failure in time (FIT) rates of the cells are computed. The default signal is selected based on pessimistic assumptions on overshoots. The IC is analyzed to determine the cells ("overshoot cells") that would actually experience overshoots. Detailed analysis is performed on the overshoot cells to determine exact FIT rates. The failure rate of the IC is determined based on the exact FIT rates for the overshoot cells and the default FIT rates for the remaining cells.

34 Claims, 4 Drawing Sheets

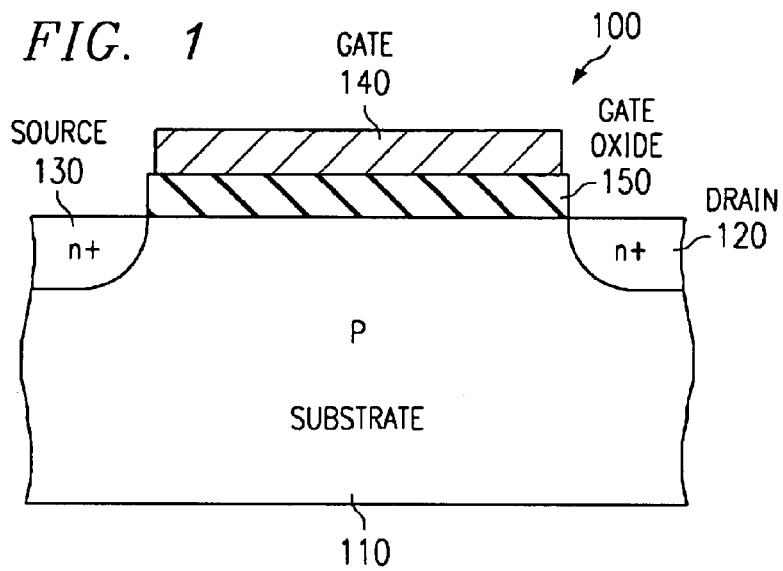
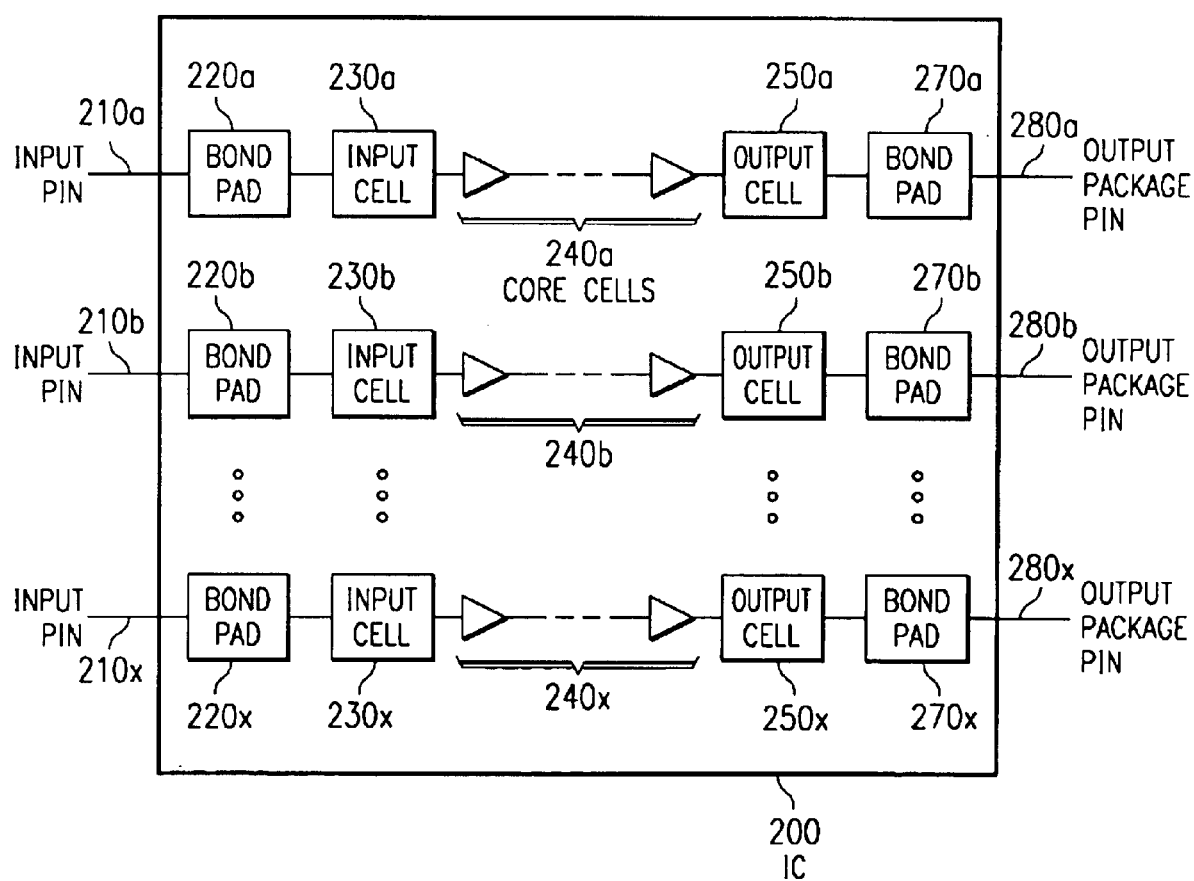

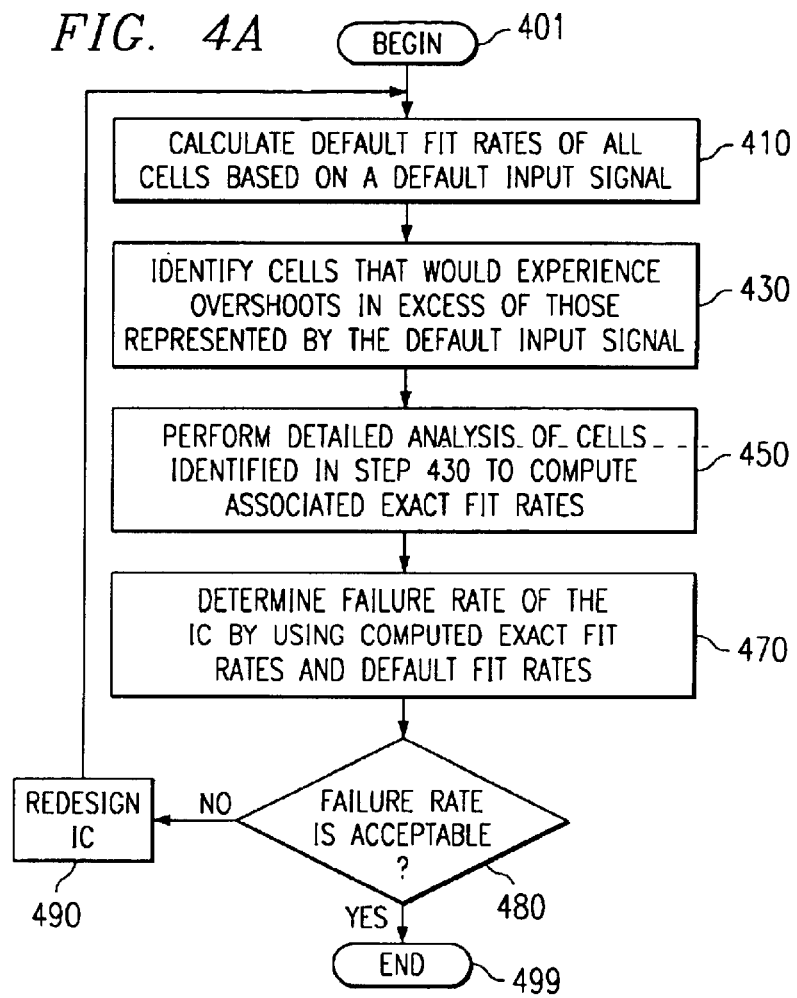
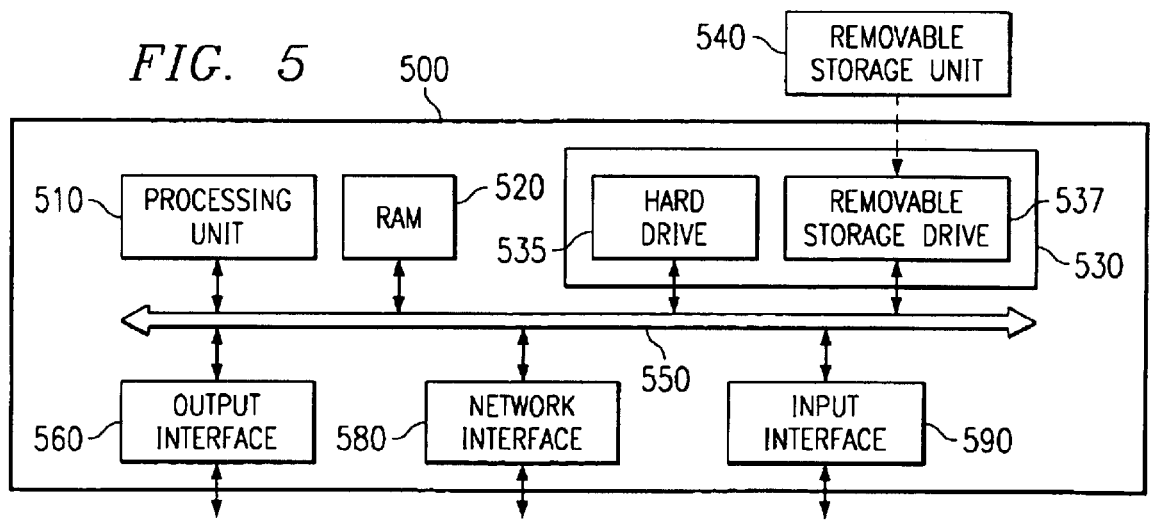

US 6,766,274 B2

DETERMINING THE FAILURE RATE OF AN INTEGRATED CIRCUIT

RELATED APPLICATION(S)

The present application is related to and claims priority from the co-pending U.S. Provisional Patent Application Serial No.: 60/309,785, entitled, "Determining The Failure Rate Of an Integrated Circuit", filed on Aug. 6, 2001, and is incorporated in its entirety herewith.

BACKGROUND OF THE INVENTION

1. Field of the Invention

The present invention relates to analysis of integrated circuits (IC), and more specifically to a method and apparatus for determining the failure rate of an integrated circuit.

2. Related Art

Integrated circuits (IC) are being deployed in large volumes in many different environments. In a typical scenario, a designer generates a design using various software design tools. The design is then used to fabricate potentially a large number of ICs. It is generally desirable that the ICs operate for a long time at least in the conditions intended for.

Accordingly, it may be necessary to analyze the design to determine whether the corresponding ICs are likely to fail over a period of time. Failure rate is a parameter which is used to measure the probability of failure of an integrated circuit over a long period of time. According to one convention, $10^9$ devices are tested for one hour and the number of devices failing is termed as the failure rate. If the failure rate is determined to be unacceptably high, a designer may have an opportunity to redesign the IC to achieve acceptable failure rate.

A well known reason for failure of an integrated circuit is the burning (or disintegration in general) of gate oxide contained in transistors, which form the integrated circuit. As is also well-known, gate-oxide is commonly used as an insulator in the gate terminal of components such as MOS-FETs (metal oxide semi-conductor field effect transistor) and the insulator disintegrates typically due to signal overshoots (in positive and negative directions) at the gate terminal.

An overshoot generally refers to the voltage level of a signal which is in excess of the voltage level defining a corresponding logical level. For example, a logical level of 1 may be represented by 1.5 V, and voltage levels exceeding 1.5 V are referred to as overshoots. Similarly, assuming 0 voltage level represents logical value of 0, excessive negative voltage may also be referred to as an undershoot or overshoot (in the negative direction).

The disintegration is particularly problematic in technologies where the gate oxide is very thin (e.g., where manufacturing processes are implemented using sub-micron technology). As the electric field is inversely proportional to the thickness, high voltage levels lead to excessive electric fields, which may cause the disintegration of the gate oxide. Therefore, it may be particularly important to check whether thin gate oxides of the transistors can tolerate any voltage overshoots that occur at the input of different logic gates consistent with the design of the IC.

One challenge in analyzing such integrated circuits (for determining the failure rate) is that typical integrated circuits contain a large number of transistors and analyzing the possible voltage range of the input signals at each transistor may consume long time. The resulting long analysis times may be unacceptable at least in situations where it is desirable to keep the design cycle times short. Accordingly, what is needed is a method and apparatus which determines quickly the occurrence of overshoots at the gates of the transistors in order to ensure a low failure rate of the transistors (and thus of the integrated circuits).

SUMMARY OF THE INVENTION

The present invention allows a quick determination of failure rate of integrated circuits (IC) by analyzing the corresponding designs (used interchangeably with IC). The IC is logically partitioned into multiple cells, and default failure in time (FIT) rate is calculated for each cell based on pessimistic assumptions about input signals ("default input signal") to the cells. In an embodiment, a default overshoot value is used as a measure of the default input signal.

The design is analyzed further to determine the cells ("overshoot cells") which would actually experience input signals with overshoots exceeding the default input signal (default overshoot overvalue). Exact (i.e., substantially precise) overshoot values are computed only for the overshoot cells by analyzing the cells in more detail. The failure rate of the IC is determined based on the exact overshoot values for the overshoot cells and the default FIT rates for the remaining cells.

As the exact FIT rates are not computed for all the cells, the time to determine the failure rate of ICs is minimized.

According to one more aspect of the present invention, an analyzer tool implementing some of the above described features may maintain a cell library containing multiple types of cells, and the default FIT rates for the type of cells may be pre-computed. When a design is to be analyzed, the pre-computed FIT rates are associated with the corresponding same type of cells. As a result, the computational requirements in determining the failure rate of an IC are further minimized.

In one embodiment, the FIT rates of cells are computed by determining the effective electric field across the gate oxide in each transistor contained in a cell. The FIT rate of a transistor is generally proportional to the electric field. The electric field in turn may depend on the input signal and material using which the transistors are fabricated. The material may be assumed to be the same in the computation of both the actual and default FIT rates. With respect to the input signal for computing exact FIT rates, design tools which analyze the circuit to determine the overshoot signal characteristics may be used.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein:

FIG. 1 is a block diagram illustrating the details of a MOSFET;

FIG. 2A is a block diagram of an IC (integrated circuits) used to illustrate several aspects of the present invention;

FIG. 4A is a flow chart describing a method by which an integrated circuit can be designed with acceptable failure rates;

FIG. 5 is a block diagram illustrating an embodiment of the present invention implemented substantially in the form of software.

DETAILED DESCRIPTION OF THE PREFERRED EMBODIMENTS

Figure 2B:
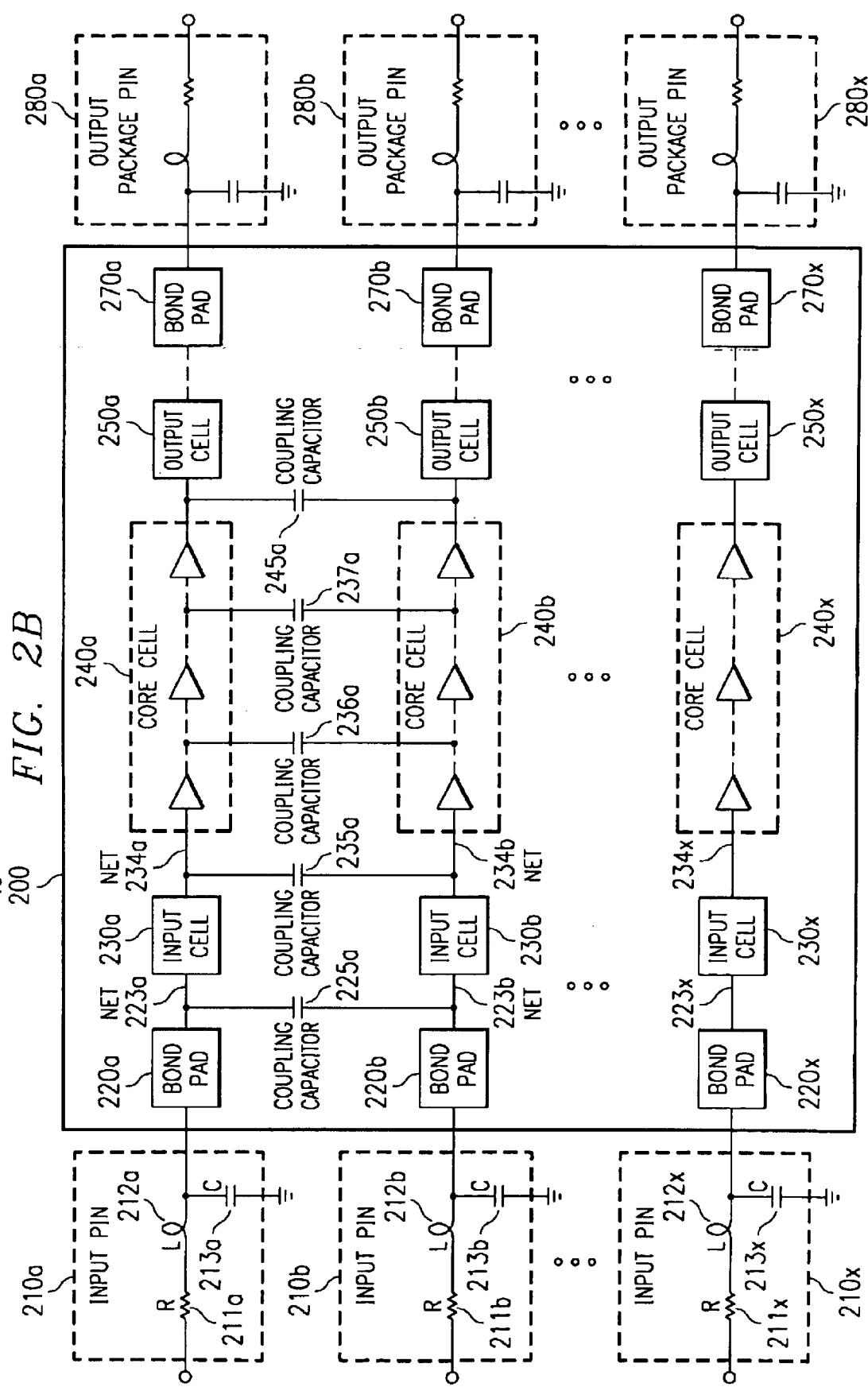
FIG. 2B is a block diagram of the logical modeling of an IC illustrating some of the principles underlying the computation of the FIT (failure in time) rates for individual cells.

1. Overview and Discussion of the Invention

The present invention enables a designer to quickly determine the probability of failure of an integrated circuit (IC) and the portions of the IC most vulnerable (sensitive) to overshoots by analyzing a design corresponding to the IC. If the probability of failure is unacceptably high, the designer can redesign the vulnerable portion of the IC until acceptable levels of probability of failure are attained.

In one embodiment, an IC is logically partitioned into multiple cells, and the failure in time (FIT) rates of all cells are determined using default parameters (e.g., pessimistic overshoot values, fabrication constants, etc.). Due to the use of the default parameters, the default FIT rates can be determined quickly.

Accurate FIT rates are computed only for the cells which possibly experience excessive overshoots during operation. Failure probability of the IC is computed based on accurate FIT rates (for cells experiencing excessive overshoots) and default FIT rates (for all other cells). If the failure rate of the IC is not within acceptable limit, the portion of the IC containing cells with high FIT rates can be redesigned.

Several aspects of the invention are described below with reference to example environments for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention. It is helpful to understand some of the underlying principles to appreciate the present invention. Accordingly, the underlying principles are briefly described first.

2. Underlying Principles

Some of the underlying principles are illustrated with reference to FIG. 1 depicting the details of a metal oxide semi-conductor field effect transistor (MOSFET). MOSFET 100 is shown containing substrate 110, drain 120, source 130, gate 140 and gate oxide 150. Gate oxide 150 operates as an insulator and is generally implemented as a thin layer of silicon oxide.

If the input voltage (on gate terminal) exceeds a normal operating voltage range, the resulting excessive electrical field may cause gate oxide 150 to disintegrate. When gate oxide 150 disintegrates, a conducting path may be formed among gate 140, source 150 and drain 120. The conducting path causes MOSFET 100 to stop operating accurately. Accordingly, it is generally desirable to avoid substantial overshoots at gate terminal 140.

A typical IC contains many (potentially millions) transistors, with some of the transistors forming a logic gate together. According to an aspect of the invention, analysis of an IC is performed at a cell level, with each cell typically corresponding to a logic gate. The manner in which an IC is partitioned for analysis is described next with reference to FIG. 2A.

FIG. 2A is a block diagram illustrating the details of an embodiment of integrated circuit (IC) 200. IC 200 is shown containing three types of cells—input cells, core cells and output cells. Each type of cell is described in further detail below.

Input cells 230-A through 230-X receive input signals through a corresponding one of the package pins 210-A through 210-X. Package pins 210-A through 210-X are connected to corresponding input cells 230-A through 230-X via bond pads 220-A through 220-X respectively.

Output cells 250-A through 250-X generate output signals on corresponding output package pins 280-A through 280-X. Output package pins 280-A through 280-X are connected to corresponding output cells 250-A through 250-X via bond pads 270-A through 270-X respectively.

Output signals represent either a signal of eventual interest to a user or can be used to drive other ICs. Core cells 240-A through 240-X are present between input cells 230-A through 230-X and output cells 250-A through 250-X.

Some of the cells (i.e., input cells 230-A through 230-X, core cells 240-A through 240-X, and output cells 250-A through 250-X) are connected by nets (wires). For example, input cell 230-A is connected to core cell 240-A by net 234-A.

An overshoot occurring at any of the cells may cause the disintegration of respective gate oxide. In addition, overshoots affect surrounding cells due to various electrical phenomenon as is well known in the relevant arts. As a result, the gate oxide in the surrounding cells may also disintegrate. Accordingly, some of the electrical effects are first described with reference to FIG. 2B, and the manner in which the effects can be analyzed is described then.

FIG. 2B is a block diagram depicting the logical electrical modeling of some of components of IC 200 of FIG. 2A. The electrical effects vary for each type of cell, i.e., input cells 230-A through 230-X, core cells 240-A through 240-X and output cells 250-A through 250-X. The electrical effects on each type of cell is described in detail below.

Input cells 230-A through 230-X receive input signals through package pins 210-A through 210-X which are typically metallic in nature, and thus contain package parasitics. Each package parasitic can be modeled as having a resistance, capacitance and inductance. Thus, package pins 210-A through 210-X are respectively shown modeled as {resistance 211-A, inductance 212-A and capacitance 213-A} through {resistance 211-X, inductance 212-X and capacitance 213-X} respectively.

Input cells 230-A through 230-X are also affected by the capacitance ("coupling capacitance") present between the surrounding adjacent nets connecting input cells and bond pads. Thus, coupling capacitances 225-A through 225-(X−1) are shown present between respective adjacent pairs of nets.

From the above, it may be appreciated that an input signal provided to input cells 230-A through 230-X may be affected due to the presence of package parasitics and coupling capacitances 225-A through 225-(X−1). The manner in which an input signal is affected is described below with reference to FIG. 3A. The signal characteristic is further used to compute effective electric field at the gate oxide, which in turn determines the FIT rate.

Figure 3A:
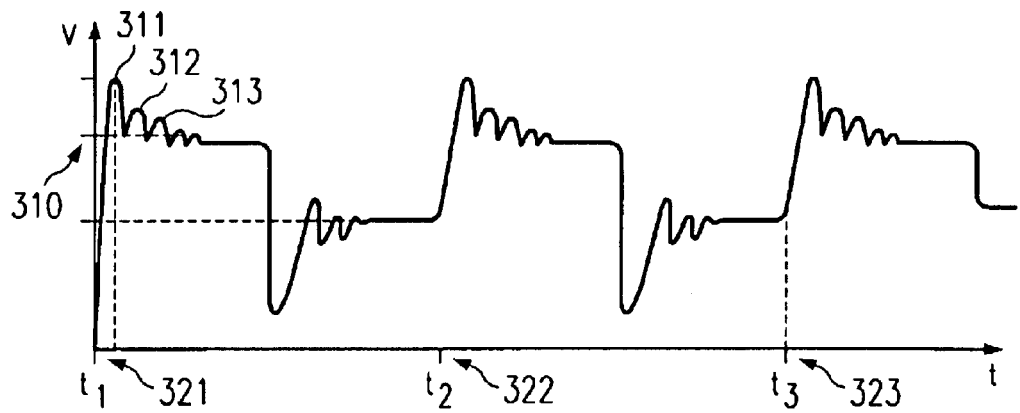
FIG. 3A is a graph illustrating a typical waveform at the input of the input cells of an IC.

FIG. 3A illustrates the waveform of a typical input signal that would be received by input cells 230-A through 230-X due to the operation of the respective package parasitic. The logical level (corresponding to 1) of the input signal is depicted as point 310. Voltage levels which are in excess of the logical level of the input signal are referred to as overshoots and is depicted by points 311, 312 and 313. As noted above, excessive overshoots may cause disintegration of the gate oxide and it is desirable to keep the overshoot levels within acceptable limits.

Continuing with reference to FIG. 2B, core cells 240-A through 240-X have coupling capacitance 235-A through 235-X, 236-A through 236-X and 237-A through 237-X present. Similarly, coupling capacitances 245-A through 245-X are present at the inputs of output cells 250-A through 250-X. The effect of coupling capacitances on an input signal provided to core cells 240-A through 240-X and output cells 250-A through 250-X are described below with reference to FIG. 3B.

Figure 3B:
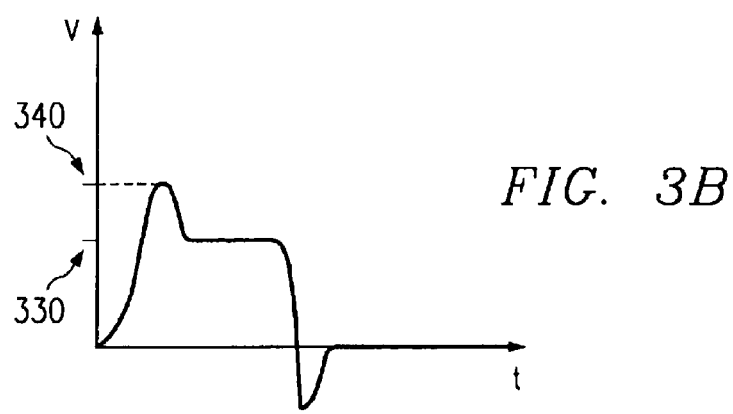
FIG. 3B is a graph illustrating a typical waveform at the inputs of the core cells and output cells.

FIG. 3B illustrates the waveform of a typical input signal which would be received by core cells 240-A through 240-X due to the coupling capacitances. The logical level of the input signal is depicted by point 330. Due to the presence of coupling capacitances at the inputs, overshoot may occur and is depicted by point 340. Similar overshoots occur when an input is provided to output cells 250-A through 250-X.

The waveforms of above form the basis for computation of the FIT rates for the cells. The general principles underlying the computation of FIT rates are described below first.

3. FIT Rates in General

In general, the FIT rate of a cell may be computed based on the FIT rate of individual transistors. In an embodiment, the FIT rate of a cell is computed to equal the sum of the FIT rates of the individual transistors contained within the cell. The manner in which the FIT rate of a transistor can be computed is described below.

The FIT rate of a transistor is proportionate to the effective electric field (Eeff) across the gate oxide over a period of time. The effective electric field in turn is dependent on the nature of the input signal and the material parameters resulting from the fabrication technology. In an embodiment, the input is logically divided into multiple intervals, and the FIT rate is computed using the following equations:

$$Eox(i)=[K_0(T_{ox})+K_1(T_{ox})*V_g(i)]/T_{ox} \quad \text{Equation (1)}$$

wherein $K_0$ and $K1$ represent coefficients to scale the voltage across the gate terminal to the actual voltage across the gate oxide and may be determined by experimentation; $T_{ox}$ represents the thickness of the oxide; $V_g(i)$ represents voltage of the input signal at the beginning/end of a respective time interval 'i'; and '*' represents the multiplication operation.

$K_0$ and $K_1$ depend upon the thickness of the oxide and doping concentration. Thus, multiple samples may be taken on the input signal (e.g., those shown in FIGS. 3A or 3B), and Eox (i) for each of the samples may be determined.

Effective electric field, Eeff, over time period '$t_2-t_1$' is calculated using the following Equation:

$$Eeff=[1/Beta]\{ln[1/(t_2-t_1)\Sigma[ti*exp[Beta*Eox(i)]]\} \quad \text{Equation (2)}$$

i wherein Beta represents reference field acceleration parameter and is a constant that changes with technology; Eox (i) represents electric field calculated for respective time interval 'i' by equation (1); '$t_2-t_1$' represents the time period of the waveform; and ln represents natural logarithm.

Beta can be obtained by determining the time taken for 50% of the devices to fail (t(50%)) as a function of gate voltage (Vg). Beta may be chosen to equal the slope of a graph ln(t50%) vs. Vg (ln representing the natural logarithm). For additional information on Beta, $K_0$ and $K_1$, the reader is referred to a document entitled, "The statistical dependence of oxide failure rates on $V_{dd}$ and $t_{ox}$ variations, with applications to process design, circuit design, and end use", by William R. Hunter, 37th Annual International Reliability Physics Symposium Proceedings (1999), IEEE 99CH36296, Page(s): 72–81.

FIT rate is calculated for a transistor based on the values obtained in Equation (2). The FIT rate (AFR) may be computed using the below equation:

$$AFR=AFR\_ref*[Area/Area\_ref*exp\ (Beta*s\_W*(Eeff-Eref))] \quad \text{Equation (3)}$$

wherein

AFR=Average Failure Rate of the transistor;

AFR_ref=reference average failure rate of a sample transistor;

Area_ref=reference gate oxide area;

Area=Area of the gate oxide of the transistor;

s_W=Weibull slope is the slope of the curve log (−ln(1−F)) vs log (tf). 'F' represents the failed fraction of gate oxides after a time 'tf';

Eref=reference electric field;

Beta=reference field acceleration parameter and changes with technology

In an embodiment, AFR_ref is obtained by stress testing many transistors at a high voltage over a period of time and determining when the transistors fails. The curve used in determining Weibull slope can also generated during the same test. Reference gate oxide area (Area_ref) is the area of the gate oxide present in the sample transistor. Reference electric field of the gate oxide (Eref) is obtained by dividing the voltage applied to the gate oxide of the sample transistor by the thickness of the gate oxide of the sample transistor.

The FIT rate of the cell can be computed based on the individual FIT rates of the transistors. From the above, it may be appreciated that the FIT rate of a cell depends on the nature of input signal, which would vary substantially among the cells. The manner in which the Equations can be used to determine failure rate of IC 200 is described below.

4. Method

FIG. 4A is a flow chart depicting a method in accordance with the present invention. The method is described with reference to FIGS. 2A, 2B, 3A and 3B for illustration. However, the method may be performed in other environments, potentially using many ICs. The method starts in step 401, in which control immediately passes to step 410.

In step 410, default failure in time (FIT) rates are calculated using Equations (1)–(3) assuming a default input signal. In general, it is desirable to select a default input signal which pessimistically includes higher voltages than what could be expected on the average, but not unduly higher that what would lead to very high FIT rates. In an embodiment, the default input signal is characterized by a default overshoot value. An approach for determining the default overshoot value is described in a section below with reference to FIG. 4B. As will be readily appreciated from the present disclosure, step (410) minimizes the number of computations as all cells needs not be analyzed (in step 450).

In step 430, cells that are substantially likely to experience overshoots exceeding the default input signal (default overshoot value) are identified. The principles described above with reference to FIG. 2B may also be used in determining the effect on the input of a cell due to the surrounding components. In general, the circuit layout can be analyzed manually to determine the overshoots. However, commercial software tools may be used to analyze complex integrated circuits.

In one embodiment, the cells that experience overshoots may be identified using a tool named, "Assura-IS", available from Cadence Corporate Headquarters, Buildings 5–9, 2655 Seely Road, San Jose, Calif. 95134. Data representing the design netlist and net parasitic values of IC 200 are provided as inputs, and the tool indicates cells experiencing overshoots.

Net parasitic values generally refer to the capacitances (e.g., ground capacitance and coupling capacitance), and net resistance/inductance that are present on the net. Net parasitic values may in turn be determined using tool named, "LV" available from K2 Technologies, Inc., 445 East 4500 South, Suite 200, Salt Lake City, Utah 84107 or another tool entitled "STARXT" available from Avant! corporation, 46871 Bayside Parkway, Fremont, Calif. 94538.

In step 450, detailed analysis is performed on the cells identified in step 430 to compute the associated effective electric field and exact FIT rates. Detailed analysis may be performed by determining (with at least some level of accuracy) the actual input signals to the identified cells, and applying Equations (1) to (3) above to determine the exact FIT rates.

In an embodiment, a tool named, "Assura-IS" noted above with respect to step 430, is used to calculate peak overshoot, rise time, and fall time for an input signal. These values can be used to model an input signal with a reasonable level of accuracy. The modeled signal can be used to compute the exact FIT rate as briefly described above.

In step 470, failure rate of the IC is computed based on exact FIT rates of the cells identified in step 430 and default FIT rates of the remaining cells of IC 200 calculated in step 410. If failure rate of the IC is not acceptable, the IC is redesigned as shown in step 490 and steps 410–470 are repeated for the redesigned IC.

Thus, the method of FIG. 4 can be used to design integrated circuits which have acceptable failure rates. The description is continued with reference to calculation of the default FIT rates (noted in step 410) in an embodiment of the present invention.

5. Determining Default Input Signal

Default input signal needs to be determined in order to calculate default FIT rates as noted above in step 410. Default input signal is modeled based on default values for overshoot voltage which may be selected by a designer. The manner in which a default value for overshoot voltage may be selected is described below with reference to FIG. 4B.

Figure 4B:
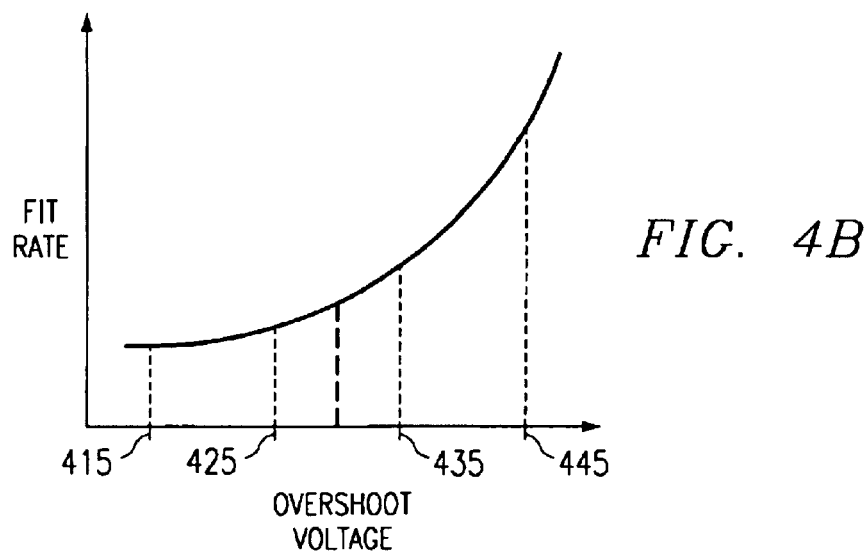
FIG. 4B is a graph illustrating the relationship between failure rate and overshoot voltage.

FIG. 4B is a graph illustrating the relationship between FIT rates and overshoot voltages of IC 200. The X-axis represents the overshoot voltage and the y-Axis represents the FIT rates. The graph between points 415 and 425 illustrates a situation in which the failure rate is low in the presence of low overshoot voltages. In addition, the failure rate does not change substantially for incremental changes of overshoot voltage.

On the other hand, the graph between point 435 and 445 represents a situation in which IC is subjected to excessive overshoot voltage and the failure rates are also high. The failure rate raises substantially for incremental changes in overshoot voltages.

Thus, it is desirable to select a overshoot voltage ("default overshoot voltage"), which is between points 425 and 435. The default overshoot voltage represents a pessimistic high end value which the cells may experience. Thus, if cells experience lower overshoot voltages, the corresponding failure rates would be lower, which is acceptable. On the other hand, if cells would actually experience higher overshoot values in operation, such cells are identified in step 430 and processed differently in step 450 as described above.

In the description of above, several commercially available tools have been described as being used with reference to steps 430. Thus, it may be necessary to implement a tool to perform at least the complementing tasks. An embodiment of such a tool is described below.

6. Analysis Tool

An analysis tool may determine the failure rate of an IC using the following input provided using other tools:

1. The cell level netlist of IC 200, for example, in a format compatible with SPICE (well known in the relevant art);
2. Identity of cells experiencing overshoots exceeding the default overshoot value;
3. Parameters which characterize input signals to overshoot cells; and
4. Default parameters (default input signal and fabrication material parameters) for computation of FIT rate values.

From the description of above, it may be appreciated that the failure rate of IC 200 may be computed using the four inputs noted above. In summary, the default FIT rates of cells are computed based on default parameter values and the exact FIT rates are computed only for cells which would actually experience overshoots during operation.

According to an aspect of the present invention, the analysis tool maintains a cell library and pre-computes (before a user starts using the analysis tool) the default overshoot values of the cells. The cell netlist (input 1 above) may further indicate the instances of the cells present in IC 200, and analysis tool may quickly assign the default FIT rates for the instances without substantial computation. As a result, the computation time in determining the default FIT rates may be considerably reduced.

According to another aspect of the present invention, a single software module (either integrated into the analysis tool noted above or provided as another independent module) may be implemented to compute the default FIT rates of step 410, and also the exact FIT rates (based on signals determined in step 450). Both computations may be based on Equations (1)–(3) described above. Thus, the module may accept different parameters to compute the default and actual FIT rates.

As noted above, several features of the present invention can be implemented in a combination of one or more of hardware, software, and firmware. An embodiment implemented in the form of sequences of instructions (software and/or firmware) is described below.

7. Software Implementation

FIG. 5 is a block diagram illustrating the details of computer system 500 in one embodiment. Computer system 500 is shown containing processing unit 510, random access memory (RAM) 520, storage 530, output interface 560, network interface 580 and input interface 590. Each component is described in further detail below.

Output interface 560 provides output signals (e.g., display signals to a display unit, not shown) which can form the basis for a suitable user interface for a user to interact with computer system 500. Input interface 590 (e.g., interface with a key-board and/or mouse, not shown) enables a user to provide any necessary inputs to computer system 500. Output interface 560 and input interface 590 can be used, for example, to enable a user to interface with computer system 500 while determining FIT rates.

Network interface 580 enables computer system 500 to send and receive data on communication networks using protocols such as Internet Protocol (IP). Network interface 580, output interface 560 and input interface 590 can be implemented in a known way.

RAM 520 and/or storage 530 may be referred to as a memory. RAM 520 may receive instructions and data on path 550 from storage 530. Even though shown as one unit, RAM 520 may be implemented as several units. Secondary memory 530 may contain units such as hard drive 535 and removable storage drive 537. Cell libraries and pre-computed FIT rates may be stored in secondary memory 530. Secondary memory 530 may store the software instructions and data, which enable computer system 500 to provide several features in accordance with the present invention.

Some or all of the data and instructions (software routines) may be provided on removable storage unit 540, and the data and instructions may be read and provided by removable storage drive 537 to processing unit 510. Floppy drive, magnetic tape drive, CD-ROM drive, DVD Drive, Flash memory, removable memory chip (PCMCIA Card, EPROM) are examples of such removable storage drive 537.

Processing unit 510 may contain one or more processors. Some of the processors can be general purpose processors which execute instructions provided from RAM 520. Some can be special purpose processors adapted for specific tasks. The special purpose processors may also be provided instructions from RAM 520. In general, processing unit 510 reads sequences of instructions from various types of memory medium (including RAM 520, storage 530 and removable storage unit 540), and executes the instructions to provide various features of the present invention described above.

Thus, computer system 500 may be implemented substantially in software to compute the failure rates of integrated circuits.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A computer implemented method for determining the failure rate of an integrated circuit, said method comprising:

partitioning said circuit into a plurality of cells;

computing a default failure in time (FIT) rate of each of said plurality of cells assuming a default input signal;

identifying a plurality of overshoot cells that experience overshoots exceeding said default input signal during operation of said integrated circuit, wherein said plurality of overshoot cells are comprised in said plurality of cells;

computing an exact FIT rate for each of said plurality of overshoot cells; and determining said failure rate of said integrated circuit based on said default FIT rate and said exact FIT rate.

2. The method of claim 1, wherein at least one of said computing a default FIT rate and said computing an exact FIT rate comprises determining a FIT rate for a transistor comprised in the cell.

3. The method of claim 2, wherein said determining comprises calculating an effective electric field in said transistor.

4. The method of claim 3, wherein said calculating comprises:

determining an input signal provided as an input to said transistor;

dividing said input signal over a period of time into a plurality of intervals;

computing an electric field for each of said plurality of intervals; and adding said electric field for all of said plurality of intervals to determine said effective electric field.

5. The method of claim 4, wherein said computing a default FIT rate comprises assigning a pre-computed FIT rate for the same type of cell for each of said plurality of cells.

6. The method of claim 5, further comprising determining a pessimistic overshoot value said transistor is likely to experience, wherein said pessimistic overshoot value is used to model said default input signal.

7. The method of claim 4, wherein said determining an exact FIT rate comprises:

determining an actual input signal for each of said plurality of overshoot cells, wherein said actual input signal used as said input signal provided as an input.

8. The method of claim 7, wherein said determining an actual input signal comprises determining a plurality of characteristics for said actual input signal.

9. The method of claim 8, wherein said plurality of characteristics comprise a peak overshoot value and a rise time.

10. The method of claim 1, wherein said determining comprises using said exact FIT rate for said plurality of overshoot cells and using said default FIT rate for the remaining ones of said plurality of cells.

11. The method of claim 1, wherein each of said plurality of cells comprises a logic gate.

12. The method of claim 1, further comprising:

maintaining a library of a plurality of types of cells; and pre-computing a pre-computed default FIT rate for each of said types of cells, wherein said computing comprises setting said default FIT rate equal to said pre-computed default FIT rate for the instances of said plurality of cells matching a corresponding one of said plurality of types of cells.

13. A method for facilitating quick determination of a failure rate of an integrated circuit, said method comprising:

maintaining a library containing a plurality of types of cells;

computing a failure in time (FIT) rate for each of said plurality of types of cells, wherein said computing comprises determining a FIT rate for a transistor comprised in one of said plurality of types of cells, wherein said determining comprises calculating an effective electric field in said transistor; and storing said FIT rate associated with a corresponding one of said plurality of types of cells.

14. The method of claim 13, wherein said calculating comprises:

determining an input signal provided as an input to said transistor;

dividing said input signal over a period of time into a plurality of intervals;

computing an electric field for each of said plurality of intervals; and adding said electric field for all of said plurality of intervals to determine said effective electric field.

15. A computer implemented method for determining the failure rate of an integrated circuit (IC), said method comprising:

receiving data representing a design of said IC, a plurality of cells forming said design, a plurality of overshoot cells comprised in said plurality of cells, a plurality of parameters characterizing an input signal corresponding to each of said plurality of cells, a default failure in time (FIT) rate of each of said plurality of cells computed based on a default input signal, wherein each of said plurality of overshoot cells would be provided an overshoot signal exceeding said default input signal during operation of said IC;

computing an exact FIT rate for each of said plurality of overshoot cells using said plurality of parameters; and determining said failure rate of said integrated circuit based on said default FIT rate and said exact FIT rate.

16. The method of claim 15, wherein said computing comprises:

determining an input signal provided as an input to a transistor comprised in said overshoot cell;

dividing said input signal over a period of time into a plurality of intervals;

computing an electric field for each of said plurality of intervals; and adding said electric field for all of said plurality of intervals to determine an effective electric field, wherein said exact FIT rate is proportionate to said effective electric field.

17. The method of claim 16, wherein said input signal is determined based on a corresponding plurality of parameters.

18. A computer readable medium comprising one or more sequences of instructions for causing a system to determine the failure rate of an integrated circuit, wherein execution of said one or more sequences of instructions by one or more processors contained in said system causes said one or more processors to perform the actions of:

partitioning said circuit into a plurality of cells;

computing a default failure in time (FIT) rate of each of said plurality of cells assuming a default input signal;

identifying a plurality of overshoot cells that experience overshoots exceeding said default input signal during operation of said integrated circuit, wherein said plurality of overshoot cells are comprised in said plurality of cells;

computing an exact FIT rate for each of said plurality of overshoot cells; and determining said failure rate of said integrated circuit based on said default FIT rate and said exact FIT rate.

19. The computer readable medium of claim 18, wherein at least one of said computing a default FIT rate and said computing an exact FIT rate comprises determining a FIT rate for a transistor comprised in the cell.

20. The computer readable medium of claim 19, wherein said determining comprises calculating an effective electric field in said transistor.

21. The computer readable medium of claim 20, wherein said calculating comprises:

determining an input signal provided as an input to said transistor;

dividing said input signal over a period of time into a plurality of intervals;

computing an electric field for each of said plurality of intervals; and adding said electric field for all of said plurality of intervals to determine said effective electric field.

22. The computer readable medium of claim 21, wherein said computing a default FIT rate comprises assigning a pre-computed FIT rate for the same type of cell for each of said plurality of cells.

23. The computer readable medium of claim 22, further comprising determining a pessimistic overshoot value said transistor is likely to experience, wherein said pessimistic overshoot value is used to model said default input signal.

24. The computer readable medium of claim 21, wherein said determining an exact FIT rate comprises:

determining an actual input signal for each of said plurality of overshoot cells, wherein said actual input signal used as said input signal provided as an input.

25. The computer readable medium of claim 24, wherein said determining an actual input signal comprises determining a plurality of characteristics for said actual input signal.

26. The computer readable medium of claim 25, wherein said plurality of characteristics comprise a peak overshoot value and a rise time.

27. The computer readable medium of claim 18, wherein said determining comprises using said exact FIT rate for said plurality of overshoot cells and using said default FIT rate for the remaining ones of said plurality of cells.

28. The computer readable medium of claim 18, wherein each of said plurality of cells comprises a logic gate.

29. The computer readable medium of claim 18, further comprising:

maintaining a library of a plurality of types of cells; and pre-computing a pre-computed default FIT rate for each of said types of cells, wherein said computing comprises setting said default FIT rate equal to said pre-computed default FIT rate for the instances of said plurality of cells matching a corresponding one of said plurality of types of cells.

30. A computer readable medium comprising one or more sequences of instructions which causes a system to determine the failure rate of an integrated circuit, wherein execution of said one or more sequences of instructions by one or more processors contained in said system causes said one or more processors to perform the actions of:

maintaining a library containing a plurality of types of cells;

computing a failure in time (FIT) rate for each of said plurality of types of cells, wherein said computing comprises determining a FIT rate for a transistor comprised in one of said plurality of types of cells, wherein said determining comprises calculating an effective electric field in said transistor; and storing said FIT rate associated with a corresponding one of said plurality of types of cells.

31. The computer readable medium of claim 30, wherein said calculating comprises:

determining an input signal provided as an input to said transistor;

dividing said input signal over a period of time into a plurality of intervals;

computing an electric field for each of said plurality of intervals; and adding said electric field for all of said plurality of intervals to determine said effective electric field.

32. A computer readable medium comprising one or more sequences of instructions which causes a system to determine the failure rate of an integrated circuit, wherein execution of said one or more sequences of instructions by one or more processors contained in said system causes said one or more processors to perform the actions of:

receiving data representing a design of said IC, a plurality of cells forming said design, a plurality of overshoot cells comprised in said plurality of cells, a plurality of parameters characterizing an input signal corresponding to each of said plurality of cells, a default failure in time (FIT) rate of each of said plurality of cells computed based on a default input signal, wherein each of said plurality of overshoot cells would be provided an overshoot signal exceeding said default input signal during operation of said IC;

computing an exact FIT rate for each of said plurality of overshoot cells using said plurality of parameters; and determining said failure rate of said integrated circuit based on said default FIT rate and said exact FIT rate.

33. The computer readable medium of claim 32, wherein said computing comprises:

determining an input signal provided as an input to a transistor comprised in said overshoot cell;

dividing said input signal over a period of time into a plurality of intervals;

computing an electric field for each of said plurality of intervals; and adding said electric field for all of said plurality of intervals to determine an effective electric field, wherein said exact FIT rate is proportionate to said effective electric field.

34. The computer readable medium of claim 33, wherein said input signal is determined based on a corresponding plurality of parameters.

* * * * *